United States Patent [19]

Limberg

[11] 4,250,461
[45] Feb. 10, 1981

[54] CURRENT MIRROR AMPLIFIER

[75] Inventor: Allen L. Limberg, Hopewell Township, Mercer County, N.J.

[73] Assignee: RCA Corporation, New York, N.Y.

[21] Appl. No.: 31,837

[22] Filed: Apr. 20, 1979

[51] Int. Cl.³ .............................................. H03F 3/04
[52] U.S. Cl. .............................. 330/288; 340/347 M

[58] Field of Search ...................... 330/288; 328/160; 307/297, 299 B; 323/4; 340/347 M Primary Examiner—James B. Mullins
Attorney, Agent, or Firm—E. M. Whitacre; J. S. Tripoli; R. G. Coalter

[57] ABSTRACT

A current mirror amplifier comprising a current divider separate from the master and slave mirroring transistors to apportion drive currents to them.

21 Claims, 17 Drawing Figures

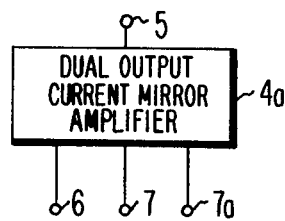
Fig.10
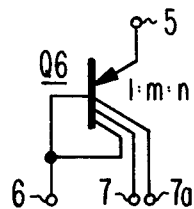   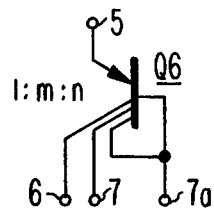   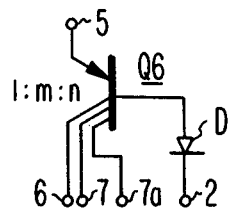
Fig.11   Fig.12   Fig.13
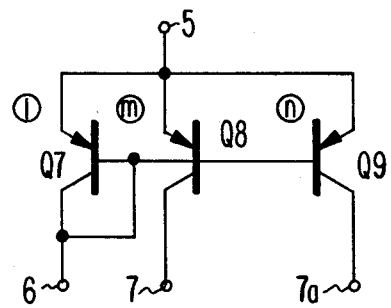   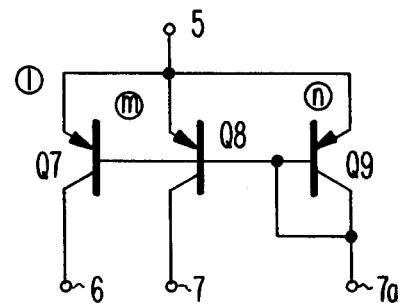
Fig.14   Fig.15
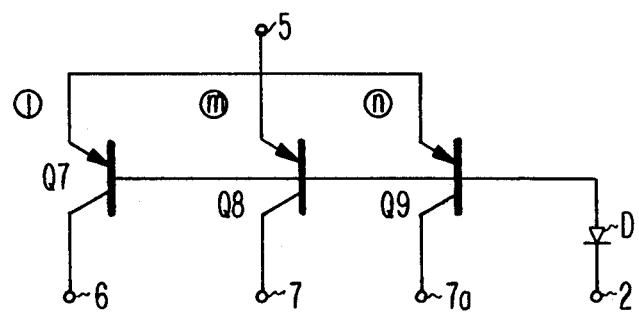
Fig.16

CURRENT MIRROR AMPLIFIER

This invention relates to amplifiers and particularly to current mirror amplifiers.

Current mirror amplifiers are well known and are widely used in electronic circuits, particularly integrated circuits. See generally: U.S. Pat. No. 3,391,311 which issued to H. C. Lin, et al., July 2, 1968; U.S. Pat. No. 3,558,672 which issued to G. R. Wilson, June 28, 1971; U.S. Pat. No. 3,835,510 which issued to H. A. Wittlinger, Sept. 10, 1974; and United Kingdom Pat. No. 1,503,448 which issued to Phillips Electronic and Associated Industries, the completed specification being published Mar. 8, 1978.

In known current mirror amplifiers, such as those mentioned above, the input or "master" transistor which conducts an input current is provided with collector-to-base feedback which causes a voltage to be produced across its base-emitter circuit. That voltage is applied across the base-emitter circuit of an output or "slave" transistor to bias the output transistor to conduct an output current. Since the input transistor converts the input current into a voltage and the output transistor reconverts the voltage into an output current, the net current gain, $A_i$, of the amplifier may be characterized by a ratio between the transconductance, gm(m), of the master transistor and the transconductance, gm(s), of the slave transistor as follows:

$$A_i = gm(s)/gm(m) \quad (1)$$

Equation (1) states that the current gain of the known current mirror amplifier is directly proportional to the transconductance of the slave transistor divided by that of the master transistor.

A significant problem is encountered with current mirror amplifiers which rely on the transconductance ratio principle, as described above, in that the current gain changes if the temperature of one transistor is allowed to vary relative to that of the other. A solution would be to operate the transistors at identical temperatures but this is difficult to do in applications where the master and slave transistors dissipate differing amounts of power. It is also difficult to achieve where the transistors have substantially different junction areas which results in unequal thermal gradients.

Current mirror amplifiers which avoid the above mentioned problem have been proposed. See, for example, U.S. Pat. No. 3,390,017 entitled "CURRENT AMPLIFIER" which issued to A. Ahmed, Nov. 2, 1976 and Technical Note No. 1187 entitled "CURRENT AMPLIFIER CIRCUITS" by A. Limberg, which was published by RCA Corporation Aug. 12, 1977. These current mirror amplifiers rely on matching of the common-emitter forward current gain ($h_{fe}$) characteristics of the master and slave transistors rather than on their transconductances. It is known that the common emitter forward current gains ($h_{fe}$'s) of transistors can be made to track better with temperature than their transconductance (gm) characteristic. For example, for each degree Kelvin of temperature change the collector current of a silicon transistor may change 8 to 9% if its emitter-to-base potential is held constant, but alternatively only 0.7% if its base current is held constant. Further, while in the past it has been more difficult to maintain equal $h_{fe}$'s as between transistors monolithically integrated together on the same die than to maintain equal transconductance characteristics, the usage of ion implantation techniques to control the degree to which impurities are diffused into silicon for forming semiconductor junctions has recently made this problem tractable.

The difficulty with the alternative approach of $h_{fe}$ matching, however, is that the known circuits require the addition of an "idler-current" branch to the basic circuit which conducts current of the same magnitude as that in the master and slave transistors. This greatly reduces the amplifier efficiency. Also, it is sometimes difficult in the known amplifiers relying on $h_{fe}$ matching to obtain a current gain other than one limited to a ratio between small integers.

The present invention is directed to meeting the need for a current mirror amplifier exhibiting both the high efficiency characteristic of amplifiers of the transconductance ratio type and the low temperature-dependent gain error characteristic of amplifiers of the matched $h_{fe}$ type.

The present invention is embodied in a amplifier circuit in which first and second current-amplifying transistors have their output circuits connected between a common terminal thereof and input and output terminals, respectively, thereof. A current dividing means separate from these transistors has an input connection to the input terminal of the current mirror amplifier and has first and second output connections to the input circuits of the first and second current-amplifying transistors, for determining the ratio of currents flowing to them. This current dividing means in certain preferred embodiments of the invention comprises a conventional current mirror amplifier employing transistors with tracking output current versus input voltage characteristics and of complementary conductivity type to that of the first and second current-amplifying transistors.

In the drawing:

FIGS. 10-16 are schematic diagrams of specific current dividing means that may be employed in the FIG. 9 circuit in various specific embodiments of the present invention.

Figure 1:
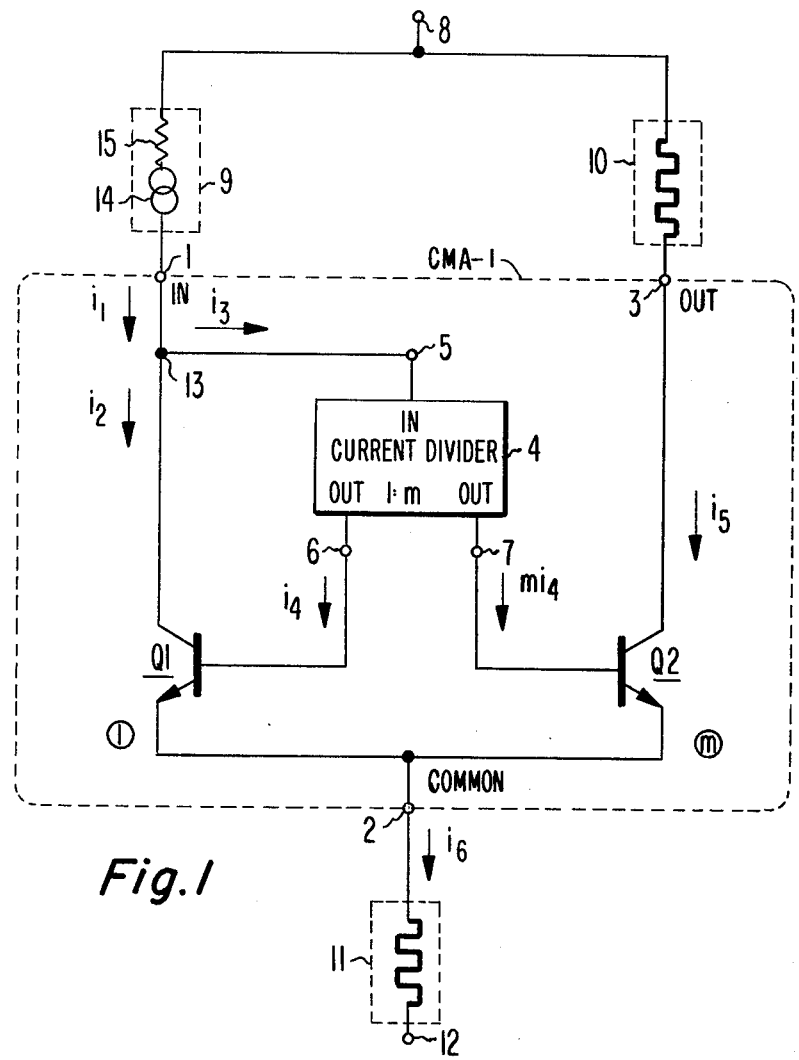
FIG. 1 is a general circuit schematic, partially in block form of a current mirror amplifier embodying the present invention.

The current mirror amplifier CMA-1 of FIG. 1 comprises a master or input transistor Q1 connected at its collector and emitter electrodes, respectively, to the CMA-1 input terminal 1 and common terminal 2 and a slave or output transistor Q2 connected at its collector and emitter electrodes, respectively, to the CMA-1 output terminal 3 and common terminal 2. Base current for transistors Q1 and Q2 is supplied by a current divider 4 having an input 5 connected to the CMA-1 input terminal 1 at node 13, a first output 6 connected to the base of transistor Q1 and a second output 7 connected to the base of transistor Q2.

Input terminal 1 of CMA-1 is coupled to a first supply voltage terminal 8 via a source of input signal current 9. For purposes of illustration and explanation current source 9, which supplies the input signal current to be amplified, is shown as a voltage source 14 in series with a source resistance 15. It should be appreciated that other suitable signal current sources may be used instead, such as suitably biased transistors, and that the current source 9 may be referenced to suitable points of potential other than supply terminal 8.

Output terminal 3 is coupled via the resistive path of load 10 to supply terminal 8. Common terminal 2 is coupled via the resistive path of load 11 to a supply terminal 12. The resistive paths may comprise any suitable direct current conductive impedance such as a resistor, inductor or foward biased semiconductor junction. Also, either (but not both) of the loads 10 and 11 may be replaced by a direct connection without substantial impedance, depending on the application in which the current mirror amplifier is to be used.

In operation, supply terminals 8 and 12 are connected to a source of operating voltage (not shown) which maintains terminal 8 at a potential more positive than that at terminal 12 and current source 9 supplies input signal current $i_1$ to input terminal 1. This current divides at node 13 into a first portion, $i_2$, which flows via the collector-emitter path of Q1 and load 11 to supply terminal 12. A second portion $i_3$, of input current i, flows to input terminal 5 of current divider 4 where it is subdivided into two portions, $i_4$ and $mi_4$, wherein "m" is a positive number which may be less than, equal to or greater than unity depending on whether CMA-1 is to be used to obtain attenuation, unity gain, or amplification of current, respectively.

The current $i_4$ of divider 4 is applied to the base of transistor Q1 thereby completing a direct-coupled feedback loop between the collector and base of Q1 which conditions Q1 to conduct the previously mentioned current $i_2$. The remaining current $mi_4$ is applied to the base of transistor Q2 to cause it to conduct an output current, $i_5$. Since the current gains of transistors Q1 and Q2 are similar, and since Q2 receives a base current m times as large as that supplied to Q1, it follows that the collector current $i_5$ of Q2 will be m times as large as $i_2$ conducted by Q1 and substantially equal to $mi_1$. This follows in view of the fact that $i_2$ differs from $i_1$ only by $i_3$ which equals the sum of the base currents of Q1 and Q2 and may be considered negligibly small.

Figure 17:
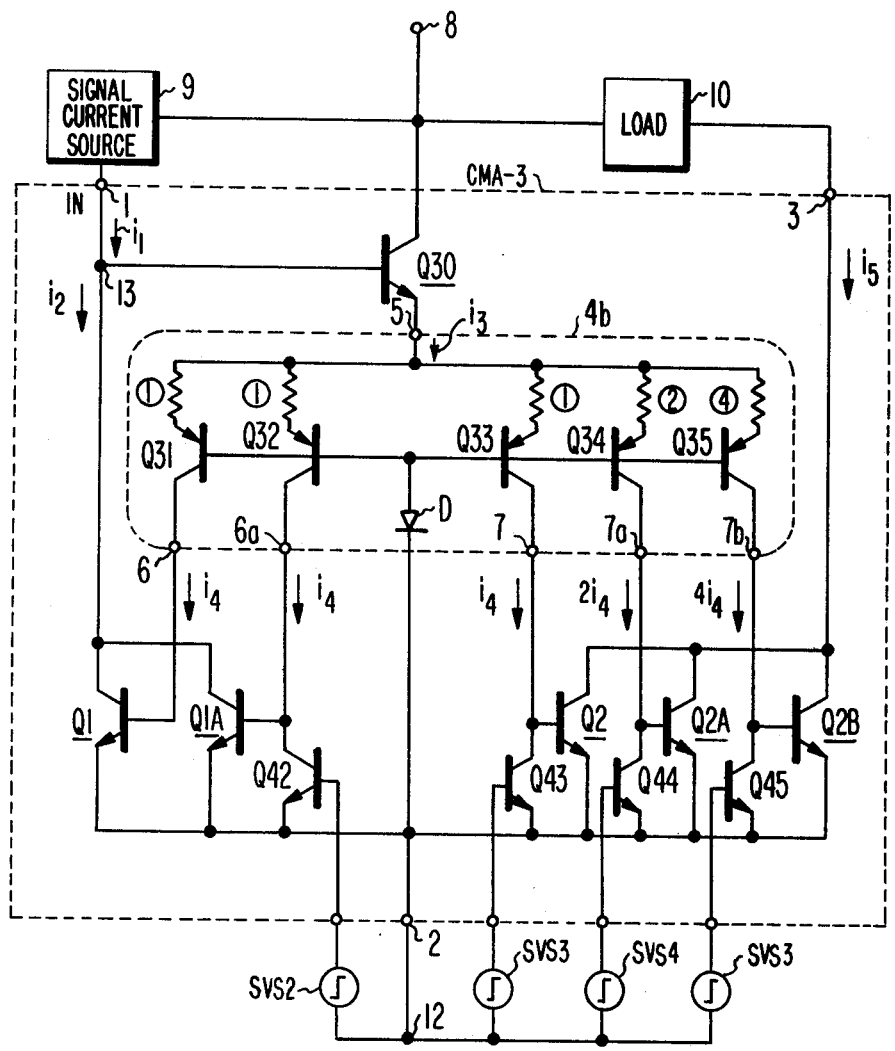
FIG. 17 is a schematic diagram illustrating a modification of the current mirror amplifier of FIG. 9 to operate as a multiplying digital-to-analog converter.

In the event that current $i_3$ may not be considered negligible so as to achieve the desired relationship, $i_5 = -mi_1$, one may connect a buffer amplifier between node 13 and terminal 5 as is illustrated in FIG. 17. Such an amplifier will reduce the magnitude of current $i_3$ flowing from node 13 yet still all the base current demands of Q1 and Q2. If such an amplifier is used, it should be of the non-inverting type to preserve the proper collector-to-base feedback relationship for master transistor Q1.

It is instructive to note that the current divider 4 provides the four functions of: (1) feedback control of master transistor Q1; (2) indirect sensing of the Q1 collector current by sensing its feedback base current; (3) feedforward control of slave transistor Q2 by proportional control of the base currents of Q1 and Q2; and (4) exclusive control of the overall current gain of CMA-1 independent of $h_{fe}$ by selection of the parameter "m". This latter factor depends upon the assumption that the current gains of transistors Q1 and Q2 are similar. This similarity may be furthered by making the base-emitter junctions of Q1 and Q2 in 1:m ratio as indicated by the encircled "1" and "m" near their respective emitter electrodes, to assure similar densities of current flow through these two junctions.

Figure 2:
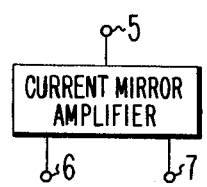
FIGS. 2-8 are schematic diagrams of specific current dividing means that may be employed in the FIG. 1 circuit in various specific embodiments of the present invention.

Current divider 4 may take the form of a conventional, component current mirror amplifier per FIG. 2 having a common connection at 5, input and output connections at 6 and 7 or at 7 and 6, respectively; being of complementary conductivity type of Q1 and Q2; and passing the sum of its input and output currents through its common connection. The component current mirror amplifiers of FIGS. 3, 4, 6, and 7 are representative of this sort of current mirror amplifier.

Figure 3:
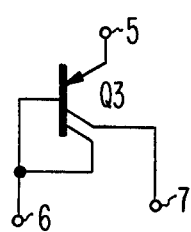
Figure 4:
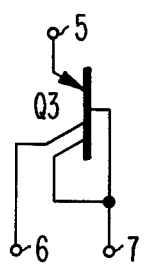
Figure 5:
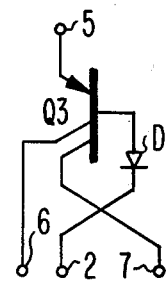

In FIGS. 3, 4 and 5 a dual-collector PNP transistor Q3 apportions the major portion of current received from input connection 5 and its emitter electrode in 1:m ratio between collector electrodes at output connections 6 and 7, respectively, owing to the respective collection efficiencies associated witht the collector regions contacted by these collector electrodes. The base electrode of Q3 is biased from output connection 6 in FIG. 3 current divider, to form a component current mirror amplifier with its input and output connections respectively at 6 and 7. The base electrode of Q3 is biased from output connection 7 in the FIG. 4 current divider to form a component current mirror amplifier with its input and output connections respectively at 7 and 6. In the FIG. 5 current divider the base electrode of Q3 is offset in potential from terminal 2 by the offset potential across diode element D, forward biased by the base current of Q3. Both collector electrodes of Q3 are offset from terminal 2 by one junction offset potential. By this means the "Early effect" (slight change in the collector current versus emitter-to-base voltage characteristics as a function of emitter-to-collector voltage) does not appreciably affect the ratio between the collector currents of Q3. This same advantage obtains with regard to the current dividers of FIGS. 2 and 3 since the collector voltages of Q3 are both referenced to the same potential point (common terminal 2) via the base-emitter junctions of Q1 and Q2.

Figure 6:
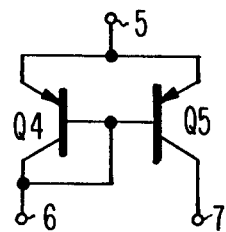
Figure 7:
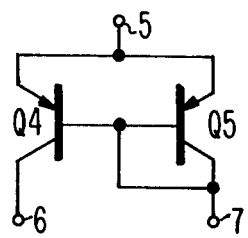
Figure 8:
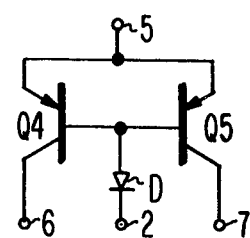

FIGS. 6, 7 and 8 show current dividers employing single collector transistors, which may be used as the current divider 4 of FIG. 1. PNP transistors Q4 and Q5 have emitters joined at input connection 5, have joined base electrodes, and have respective collector electrodes at output connections 6 and 7, respectively. Transistors Q4 and Q5 are selected to have collector current versus emitter-to-base voltage characteristics (transconductances) in 1:m ratio for similar values of emitter-to-base voltage. Q4 and Q5 have like collector potentials so neither the Early effect mentioned previously nor differential heating effects affect the proportionality between their respective collector currents.

The joined base electrodes of Q4 and Q5 are biased from output connection 6 in FIG. 6 current divider, to form a component current mirror amplifier with a current gain of m between its input and output connections respectively at 6 and at 7. The joined base electrodes of Q4 and Q5 are biased from output connection 7 in the FIG. 7 current divider, to form a component current mirror amplifier with a current gain of 1/m between its input and output connections respectively at 7 and at 6. In FIG. 8 the joined base electrodes of Q4 and Q5 are offset in potential from terminal 2 by the offset potential across diode element D which is forward biased by the combined base currents of Q4 and Q5. Diode element D may comprise a self-biased transistor or a Schottky barrier diode in either of the FIG. 5 or FIG. 8 circuits.

It may be desirable to trim the current gain of CMA-1- e.g., when it is used for balanced to single-ended signal conversion purposes in the initial, differential-input amplifier stage of an operational amplifier. This is simply done using a relatively high impedance potentiometer with first and second end terminals respectively connected to output connections 6 and 7 of current divider 4 and with an adjustable tap terminal connected to terminal 12 (preferably via a "stop" resistor to prevent inadvertant short circuiting of the emitter-base junction of Q1 or Q2). Other, more sophisticated circuits to differentially apply trim currents of positive or negative polarities to connections 6 and 7 may be used, also. Where the current divider is basically of the form shown in FIGS. 6, 7 or 8 the direct connections of the emitter electrodes of Q4 and Q5 may be replaced by differentially variable resistance to trim the current division in current divider 4.

Figure 9:
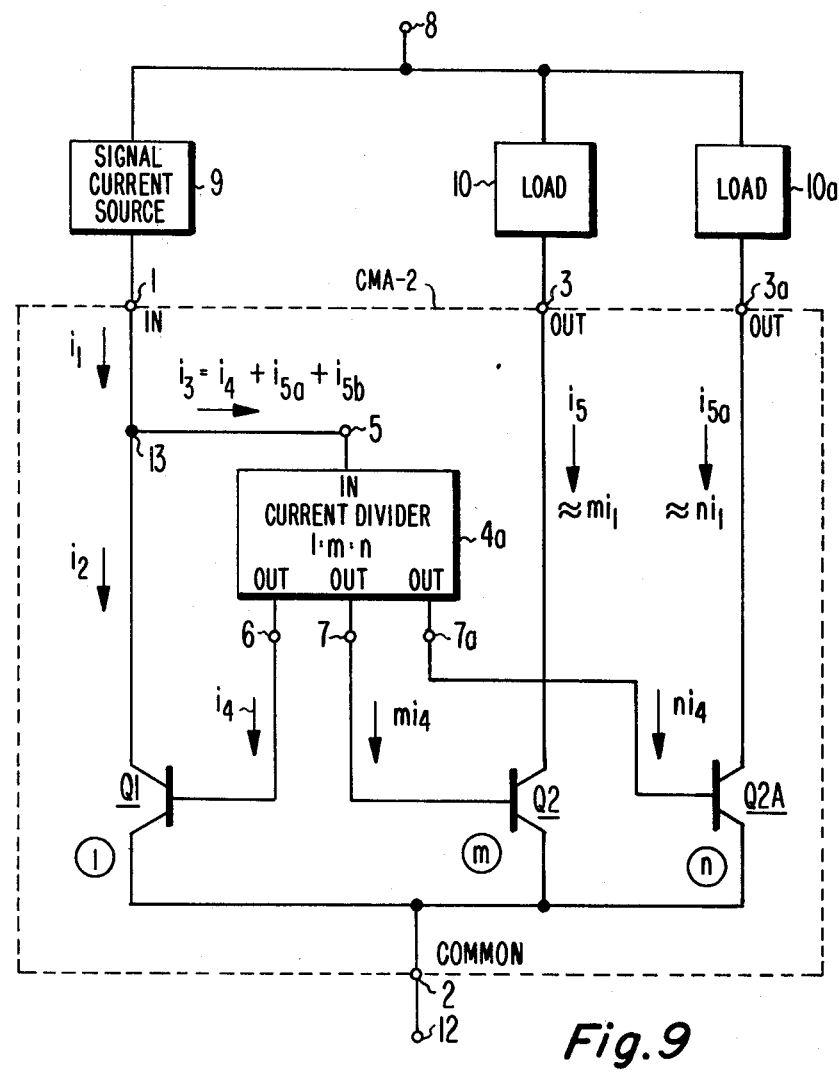
FIG. 9 is a general schematic diagram, partially in block form, illustrating a modification of the current mirror amplifier of FIG. 1 for providing a plurality of output currents.

In the modified current mirror amplifier CMA-2 of FIG. 9, current divider 4a has been provided with an additional output 7a connected to supply base current $ni_4$ to a further output transistor Q2A, where n may be any positive number. This additional "slave" transistor is connected at its emitter to common terminal 2 which is directly connected to supply terminal 12. The collector of Q2A is coupled via additional load 10a to supply terminal 8. As in the FIG. 1 circuit, the master Q1 and slave Q2, Q2A transistors have similar current gains. As previously mentioned this may be facilitated by selecting the base-emitter junction areas of Q1, Q2 and Q2A to be in the same ratio as their respective base currents provided by current divider 4a, namely, 1:m:n, respectively. Operation of the FIG. 9 circuit is similar to that of FIG. 1 except that an additional output current substantially equal to $ni_1$ is provided by slave transistor Q2A at output terminal 32. (The number of slave transistors may be extended at will by using a current divider with a suitable number of outputs.)

FIG. 10 illustrates that the current divider 4a may itself be a plural-output current mirror amplifier of conventional design, one of the terminals 6, 7 and 7a being at its input connection, the others being at its output connections, and terminal 5 being at its common connection. FIGS. 11, 12, 14 and 15 show representative specific embodiments of this plural-output component current mirror amplifier that can be used as current divider CD2.

In FIGS. 11, 12 and 13, a multiple-collector PNP transistor Q6 has collector electrodes with collection efficiencies in 1:m:n ratio, respectively, connected to output terminals 6, 7 and 7a respectively, of current divider 4a and has an emitter electrode connected to input terminal 5 of current divider 4a. In FIG. 11 the base electrode of Q6 has terminal 6 connected to it, so Q6 is connected as a component current mirror amplifier with input connection at terminal 6, output connections 7 and 7a, and with common connection at 5. In FIG. 12 the base electrode of Q6 has terminal 7a connect to it, so Q6 is connected as a component current mirror amplifier with input connection at 7a, with output connections at 6 and 7, and with common connection at 5. In FIG. 13, Q6 has its base electrode offset in potential from the common terminal 2 of CMA-2 by the potential drop across diode D appearing responsive to the base current of Q6.

In FIGS. 14, 15 and 16 PNP transistors Q7, Q8 and Q9 have respective transconductances in 1:m:n ratio as indicated by the encirculed "1", "m", and "n" near their respective emitter electrodes. The collector electrodes of Q7, Q8, and Q9 are connected to terminals 6, 7 and 7a, respectively, and their emitter electrodes connected to terminal 5. In FIG. 14 the interconnected base electrodes of Q7, Q8 and Q9 are biased from terminal 6 making it the input connection of a component plural-output current mirror amplifier having output connections at 7 and 7a and having a common connection at 5. In FIG. 15 the interconnected base electrodes of Q7, Q8 and Q9 are biased from connection 7a, making it the input connection of a component plural output current mirror amplifier having output connections at 6 and 7 and having a common connection at 5. In FIG. 16 the interconnected base electrodes of Q7, Q8 and Q9 are connected to the common terminal 2 of CMA-2 via diode D poled to be forward biased by their combined base currents.

The current mirror amplifier CMA-3 of FIG. 17 is similar to CMA-2 of FIG. 9 but includes a further slave transistor Q2B and provisions for summing the slave transistor output currents and for shunt switching of their base-emitter circuits responsive to a digital input signal manifestation. The master mirroring transistor Q1 is provided with a parallel connected additional transistor Q1A which also may be controlled by the digital signal manifestation. A further change is that a buffer amplifier (emitter follower Q30) is connected between node 13 and input terminal 5 of current divider 4b. As previously mentioned, use of a buffer amplifier to isolate divider 4 from node 13 assures that the input current $i_1$ is substantially equal to the current $i_2$ conducted by the master mirroring transistor Q1. These changes, as further described in the following discussion of circuit operation, enable digital control of the current gain of CMA-3 so that the output current, $i_5$, is proportional to the product of the input current $i_1$, multiplied by the digital signal manifestation which may be weighted or unweighted binary signal. This illustrates an application of CMA-3 as a multiplying digital to analog converter which may be used, for example, to provide digital gain control of an analog signal.

Current divider 4b divides the emitter current of NPN transistor 30 in 1:1:1:2:4 ratio for application to the base electrodes of transistor Q1, Q1A, Q2, Q2A, and Q2B. Divider 4b comprises five transistors Q31–Q35 each having an emitter electrode coupled via a respective resistance to terminal 5 and a collector electrode connected to a respective one of the output terminals 6, 6a, 7, 7a and 7b. To achieve the desired division ratio the base emitter junction areas of Q31–Q35 are proportioned in 1:1:1:2:4 ratio as indicated by the encircled numerals near their emitter electrodes. The illustrated emitter resistors are not essential but aid in achieving the desired current division ratio. If emitter resistors are used their conductances should be in a ratio corresponding to the previously mentioned area ratio 1:1:1:2:4.

The base currents of Q31, Q32, Q34 and Q35 flow in common through diode D to supply terminal 12 developing a potential offset thereacross that determines the identical base potentials of those transistors. (Alternatively, the joined base electrodes of Q31, Q32, Q33, Q34 and Q35 could be connected to the base electrode of NPN transistor Q1; and diode D, dispensed with.) The collector current of Q31 continually is applied as the base current of an NPN first master mirroring transistor Q1; and the collector current of Q32 is applied as the base current of an NPN second master mirroring transistor Q1A as long as another NPN transistor Q42 is not switched into conduction by switching voltage source SVS2 applying forward bias to the base of Q42.

In the case where only the first of the first and second master mirroring transistors Q1 and Q1A is conductive, this first mirroring transistor Q1 will be supplied sufficient base current to condition it to conduct all the current $i_1$ flowing through the input terminal 1 of the current mirror amplifier CMA-3 circuitry, except for the small base current that must be supplied to emitter-follower transistor Q30 to sustain conduction in Q1 by means of degenerative direct-coupled collector-to-base current feedback. That is, Q31 supplies, as base current to Q1, a collector current substantially equal to $i_1$ divided by $h_{fe\text{-}NPN}$, the common-emitter forward current gain of the NPN transistors in the circuit. Q33 supplies a collector current $i_4$ substantially equal to $i_1/h_{fe}$ as base current to NPN transistor Q2 to condition Q2 to demand a collector current essentially equal to $i_1$ as a component of the output current $i_5$ at terminal 3, so long as NPN transistor Q34 is not switched into conduction by switching voltage source SVS3 applying forward bias to the base of Q34. Q34 supplies a collector current $2i_4$ substantially equal to $2i_1/h_{fe}$ as base current to NPN transistor Q2A to condition Q2A to demand a collector current essentially equal to $2i_1$ as a component of $i_5$ so long as NPN transistor Q44 is not switched into conduction by switching voltage source SVS4 applying forward bias to the base of Q44. Q35 supplies a collector current $4i_4$ substantially equal to $4i_1/h_{fe}$ as base current to NPN transistor Q2B to condition Q2B to demand a collector current essentially equal to $4i_1$ as a component of $i_5$ so long as NPN transistor Q45 is not switched into conduction by switching voltage source SVS5 applying forward bias to the base of Q45.

The selective application of forward bias to the base of Q43 by source SVS3 will turn on Q43. The conduction of Q43 causes it to divert the collector current of Q33 to itself and away from the base of Q2, so Q2 will no longer be conditioned to demand any collector current. The selective application of forward bias to the base of Q44 by source SVS4 will turn on Q44, causing it to divert the collector current of Q34 to itself and away from the base of Q2A; so Q2A will no longer be conditioned to demand any collector current. The selective application of forward bias to the base of Q45 by source SVS5 will turn on Q45 and turn off Q2B, so Q2B will no longer be conditioned to demand any collector current. By selectively forward biasing Q43, Q44 and Q45, the output current, $i_5$, can be made to assume any of the following values: 0, $i_1$, $2i_1$, $3i_1$, $4i_1$, $5i_1$, $6i_1$ or $7i_1$.

In the case where source SVS2 does not turn on Q42 to divert the collector current of Q32 from the base of Q1A, the input current $i_1$ is apportioned to the collectors of Q1 and Q1A. Then, the degenerative collector-to-base current feedback of Q1 and Q1A adjusts their respective base currents each to be $i_1/2h_{fe}$. The collector currents of Q31, Q32, Q33, Q34 and Q35 are all adjusted to their former value. Responsive to this, the collector current demands of Q2, Q2A and Q2B, if any, will also be halved.

The properties of the switched current mirror amplifier circuitry shown in FIG. 17 have application in multiplying digital to analog signal conversion systems wherein an output current $i_5$ is produced proportional to the product of a variable input current $i_1$ multiplied by a digital signal manifestation. Other types of systems can take advantage of certain of these properties. For example, the weighting of the collector currents of Q2, Q2A and Q2B might be made equal and the collector electrodes of Q2, Q2A and Q2B might be provided separate output terminals to provide a commutated analog signal distribution system for use in digital filtering.

In the embodiments of the invention shown and described herein various forms of current dividers are illustrated some of which comprise or are adaptations of conventional (transconductance controlled) current mirror amplifiers employing bipolar transistors. Alternatively, current division may be provided by suitably biased field effect transistors and conventional field effect transistor current mirror amplifiers may be used for this purpose. In applications where it is desired to achieve either very large current gains (m>1) or very high attenuation factors (m>1) one may employ more complex current mirror amplifiers for current divider 4, 4a, or 4b. See, for example, U.S. Pat. No. 4,028,631 entitled "CURRENT AMPLIFIERS" which issued to A. Ahmed, June 7, 1977, and which describes circuitry in which rather large values of m can be obtained readily and which is practical to integrate with rather modest area requirements on a monolithic circuit die. A somewhat similar advantage may be had by implementing current divider 4, 4a or 4b with a cascade connection of current mirror amplifiers. See, for example, U.S. Pat. No. 3,766,543 entitled "CURRENT DIVIDER" which issued to Te Winkel et al, Oct. 16, 1973.

What is claimed is:

1. In a current mirror amplifier of the kind comprising an input terminal to which an input signal current to be amplified is applied, and output and common terminals coupled to respective supply voltage terminals, one such coupling being via a load impedance, a master mirroring transistor of a given conductivity type connected at its collector and emitter electrodes to said input and common terminals, respectively, a slave mirroring transistor of said given condictivity type connected at its collector and emitter electrodes to said output and common terminals, respectively, and control circuitry coupled to said input terminal and to the base electrodes of said master and slave mirroring transistors for conditioning said master mirroring transistor to conduct substantially all of said input current between said input and common terminals and for conditioning said slave mirroring transistor to conduct a predetermined output current between said output and common terminals in proportion to said input current, the improvement wherein said control circuitry comprises:

a current divider for dividing a control current supplied thereto into at least two portions in ratio 1:m, one portion being supplied as the sole source of base current to the master mirroring transistor, the other portion being supplied as the sole source of base current to said slave mirroring transistor; and circuit means for supplying said control current to said current divider in proportion to the magnitude of the input signal current supplied to said input terminal of said current mirror amplified, said transistors exhibiting substantially equal current gains for rendering the overall input-output current ratio of said current mirror amplifier dependent solely upon said ratio of said current divider.

2. A current mirror amplifier as recited in claim 1 wherein said current divider comprises a plural-collector transistor of opposite conductivity type to said master and slave mirroring transistors, having an emitter electrode to which said control current is supplied, a first collector electrode connected to the base electrode of said master mirroring transistor, a second collector electrode connected to the base electrode of said slave mirroring transistor, and a base electrode connected to a source of biasing current.

3. A current mirror amplifier as recited in claim 2 wherein said base electrode of said plural-collector transistor is connected to a selected one of its collector electrodes.

4. A current mirror amplifier as recited in claim 3 wherein said base electrode of said plural-collector transistor is connected to said common terminal of said current mirror amplifier by means consisting of a single forward biased diode.

5. A current mirror amplifier as recited in claim 2, wherein said circuit means comprises a direct connection of said emitter of said plural-collector transistor to the input terminal of said current mirror amplifier.

6. A current mirror amplifier as recited in claim 2 wherein said circuit means comprises a buffer amplifier having an input connected to the input terminal of said current mirror amplifier and an output connected to the emitter electrode of said plural-collector transistor.

7. A current mirror amplifier as recited in claim 1 wherein said current divider comprises a component current mirror amplifier having a common terminal to which said control current is supplied, an input terminal connected to the base electrode of one of said mirroring transistors and an output terminal connected to the base electrode of the other of said mirroring transistors.

8. A current mirror amplifier as recited in claim 7 wherein the collector electrode of said master mirroring transistor is direct coupled to the common terminal of said component current mirror amplifier.

9. A current mirror amplifier as recited in claim 7 wherein said common terminal of said component current mirror amplifier is coupled to the output of a buffer amplifier, the input of which is connected to the collector electrode of said mastering mirroring transistor.

10. A current mirror amplifier as recited in claim 1 further comprising at least one additional slave transistor, the emitter electrode thereof being connected to said common terminal, the collector electrode thereof being connected to a separate respective output terminal, and wherein said current divider includes a further output terminal connected to the base electrode of said at least one additional slave transistor for supplying base current thereto having a predetermined relationship to the base current supplied to said master mirroring transistor.

11. A current mirror amplifier as recited in claim 10 further comprising a plurality of switches, each switch being connected in parallel with the base-emitter junction of a respective one of said slave transistors, said switches being controllable in response to a digital signal manifestation.

12. A current mirror amplifier as recited in claim 11 further comprising means for combining the output currents of said slave mirroring transistors to provide an output current proportional to said input current and said digital signal manifestation.

13. A current mirror amplifier comprising:

an input signal connected to receive a changing input current;

a number n, where n is at least one, of output terminals, each connected to supply a respective output current in proportional response to said input current;

a common terminal;

a master mirroring transistor of a first conductivity type having a collector electrode connected to said input terminal, having an emitter electrode connected to said common terminal, and having a base electrode;

a number n of slave mirroring transistors of said first conductivity type, each having a respective collector electrode connected to a respective one of said output terminals, having a respective emitter electrode connected to said common terminal, having a respective base electrode, and exhibiting a current gain between its base and collector electrodes that is substantially the same as the current gain exhibited by said master mirroring transistor between its base and collector electrodes; and current dividing means exclusive of said mirroring transistors having an input connection to which said input terminal is direct-coupled and having a plurality, (n+1) in number, of output connections each connected to a respective one of the base electrodes of said mirroring transistors.

14. A current mirror amplifier as set forth in claim 13 wherein said current dividing means includes:

a plural-collector transistor of a second conductivity type complementary to said first conductivity type having a base electrode, having an emitter electrode at the input connection of said current dividing means, and having a respective collector electrode at each output connection of said current dividing means; and potential offsetting means coupled between said common terminal and the base electrode of said plural-collector transistor for biasing it for normal transistor operation.

15. A current mirror amplifier as set forth in claim 14 wherein said potential offsetting means is a unidirectionally conductive semiconductor diode means poled to conduct the base current of said plural-collector transistor.

16. A current mirror amplifier as set forth in claim 13 wherein said current dividing means includes:

a plurality, (n+1) in number, of transistors of a second conductivity type complementary to said first conductivity type, having respective emitter electrodes connected to the input connection of said current dividing means, having respective collector electrodes at separate ones of the output connections of said current dividing means, and having respective base electrodes; and potential offsetting means coupled between said common terminal and an interconnection of the base electrodes of said transistors of said second conductivity type for biasing them for normal transistor operation.

17. A current mirror amplifier as set forth in claim 16 wherein said potential offsetting means is a unidirectionally conductive semiconductor diode means poled to conduct the base currents of said transistors of said second conductivity type.

18. A current mirror amplifier as set forth in claim 13 wherein said current dividing means consists of a component current mirror amplifier having an input connection used as one of the output connections of said current dividing means, having a respective output connection providing each of the n other output connections of said current dividing means, and having a common connection used as the input connection of said current dividing means.

19. A current mirror amplifier as recited in claim 13 wherein the number n is at least two and further comprising a separate switch connected in parallel with the base-emitter junction of each of said slave mirroring transistors, each switch being responsive to a respective digital control signal supplied thereto for opening and closing and means for summing the output currents of said slave transistors.

20. A current mirror amplifier as recited in claim 13 further comprising a switch connected in parallel with the base-emitter junction of at least one of said transistors, said switch being responsive to a digital control signal for opening and closing.

21. A current mirror amplifier as recited in claim 13 further comprising at least one further master mirroring transistor of said first conductivity type having a collector electrode connected to said input terminal, having an emitter electrode connected to said common terminal and having a base electrode connected to a further output connection of said current dividing means; and switch means connected in parallel with the base-emitter junction of said further master mirroring transistor.

* * * * *